United States Patent [19]

Shimono et al.

[11] Patent Number: 5,465,383
[45] Date of Patent: Nov. 7, 1995

[54] SYSTEM FOR FORMING TEST PATTERNS FOR LARGE SCALE INTEGRATED CIRCUITS

[75] Inventors: Takeshi Shimono, Tokyo; Noriyo Konishi, Ishikawa, both of Japan

[73] Assignee: NEC Corporation, Tokyo, Japan

[21] Appl. No.: 404,126

[22] Filed: Mar. 14, 1995

Related U.S. Application Data

[63] Continuation of Ser. No. 134,875, Oct. 12, 1993, abandoned, which is a continuation of Ser. No. 612,473, Nov. 14, 1990, abandoned.

[30] Foreign Application Priority Data

Nov. 15, 1989 [JP] Japan ............................. 1-296756

[51] Int. Cl.$^6$ ...................... G06F 11/25; G06F 11/263
[52] U.S. Cl. .................. 395/800; 395/500; 371/27; 364/264.3; 364/265.5; 364/266.4; 364/282; 364/DIG. 1
[58] Field of Search ...................... 395/500, 800; 371/27; 364/578

[56] References Cited

U.S. PATENT DOCUMENTS

| | | | |
|---|---|---|---|
| 4,097,797 | 6/1978 | Finet | 371/25.1 |
| 4,313,200 | 1/1982 | Nishiura | 371/25 |
| 4,590,581 | 5/1986 | Widdoes, Jr. | 364/578 |
| 4,656,632 | 4/1987 | Jackson | 371/20 |
| 4,759,021 | 7/1988 | Kawaguchi et al. | 371/27 |
| 4,807,229 | 2/1989 | Tada | 371/27 |
| 4,817,093 | 3/1989 | Jacobs et al. | 371/25 |
| 4,905,183 | 2/1990 | Kawaguchi et al. | 364/900 |
| 5,068,812 | 11/1991 | Schaefer et al. | 364/578 |
| 5,084,876 | 1/1992 | Welham et al. | 371/23 |
| 5,095,483 | 3/1992 | Dubler et al. | 371/25.1 |
| 5,126,966 | 6/1992 | Hafeman et al. | 395/500 |

OTHER PUBLICATIONS

"An Introduction To Cad For VLSI" by Stephen M. Trimberger Kluwer Academic Publishers, 1987, pp. 242–248.

*Primary Examiner*—Kevin J. Teska
*Assistant Examiner*—Ayni Mohamed
*Attorney, Agent, or Firm*—Foley & Lardner

[57] ABSTRACT

A system for forming test patterns of an LSI as a test pattern formation target includes an extraction condition setting means and a state value data acquiring means. The extraction condition setting means sets a state value extraction condition for the LSI. The state value data acquires data of the state values of the input/output pins of the LSI during the logic simulation of a logic circuit including the LSI while the condition set by the extraction condition setting means is satisfied. The test patterns of the LSI are formed on the basis of the data acquired by the state value data acquiring means.

12 Claims, 2 Drawing Sheets

CS : CHIP SELECT SIGNAL

SYSTEM FOR FORMING TEST PATTERNS FOR LARGE SCALE INTEGRATED CIRCUITS

This application is a continuation of application Ser. No. 08/134,875, filed Oct. 12, 1993 now abandoned, which is a continuation of Ser. No. 07/612,473 now abandoned, filed Nov. 14, 1990.

BACKGROUND OF THE INVENTION

The present invention relates to a system for forming test patterns for a large scale integrated circuit (LSI) included in a logic circuit and, more particularly, to a system for forming test patterns for a target LSI on the basis of logic simulation results of an overall logic circuit.

In a system for testing the functions and the like of LSIs, a large number of test patterns must be prepared on the basis of combinations of the state values of input pins and the state values of corresponding output pins which are obtained when an LSI as a test target is in a normal state. Various types of systems for forming test patterns for an LSI have been known. According to one of these systems, test patterns for a target LSI are formed on the basis of results of logic simulation of an overall logic circuit which is executed when, e.g., design of a logic circuit including the LSI is completed. In such a conventional system for forming test patterns for an LSI, after input/output pins of a target LSI (for which test patterns are to be formed) in a logic circuit are designated, simulation input patterns are input to perform the logic simulation of the overall logic circuit. In the process of the logic simulation, data of the state values of the designated input/output pins which corresponds to all the clocks of the simulation input patterns are acquired in units of clocks. The acquired data are then converted into test patterns.

An advantage of the above-described conventional system for forming test patterns for an LSI is that test patterns for a target LSI can be obtained by using logic simulation results of a logic circuit.

When each of the LSIs in a logic circuit is taken into consideration, the following point should be noted. It is rare for a given LSI to be always operated during an operation of the logic circuit, and the period during which it is not operated is long. In the above-described conventional system for forming test patterns for an LSI, however, data of the state values of the input/output pins of a target LSI is acquired for all the clocks of simulation input patterns to a logic circuit. That is, useless data is also acquired, i.e., data acquired when the target LSI is not operated. This poses a problem in terms of efficiency of formation of test patterns.

SUMMARY OF THE INVENTION

It is an object of the present invention to provide a system for forming test patterns for an LSI, in which test patterns can be efficiently formed by acquiring data of only the state values of the input/output pins of a target LSI (for which test patterns are to be formed) while it is actually being operated.

In order to achieve the above object, there is provided a system for forming test patterns for an LSI as a test pattern formation target on the basis of data of state values of input/output pins of the LSI acquired during logic simulation of a logic circuit including the LSI, comprising, extraction condition setting means for setting a state value extraction condition for the LSI, and state value data acquiring means for acquiring the data of the state values of the input/output pins of the LSI during the logic simulation while the condition set by the extraction condition setting means is satisfied, wherein the test patterns for the LSI are formed on the basis of the data acquired by the state value data acquiring means.

In the system for forming test patterns for an LSI according to the present invention, the extraction condition setting means sets a condition for extracting the state values of the input/output pins of an LSI as a test pattern formation target included in a logic circuit for which logic simulation is to be performed, and the state value data acquiring means acquires data of the state values of the input/output pins of the LSI during the logic simulation while the set condition is satisfied, thereby forming test patterns for the LSI on the basis of the acquired data.

DESCRIPTION OF THE PREFERRED EMBODIMENT

An embodiment of the present invention will be described below with reference to the accompanying drawings.

Figure 1:
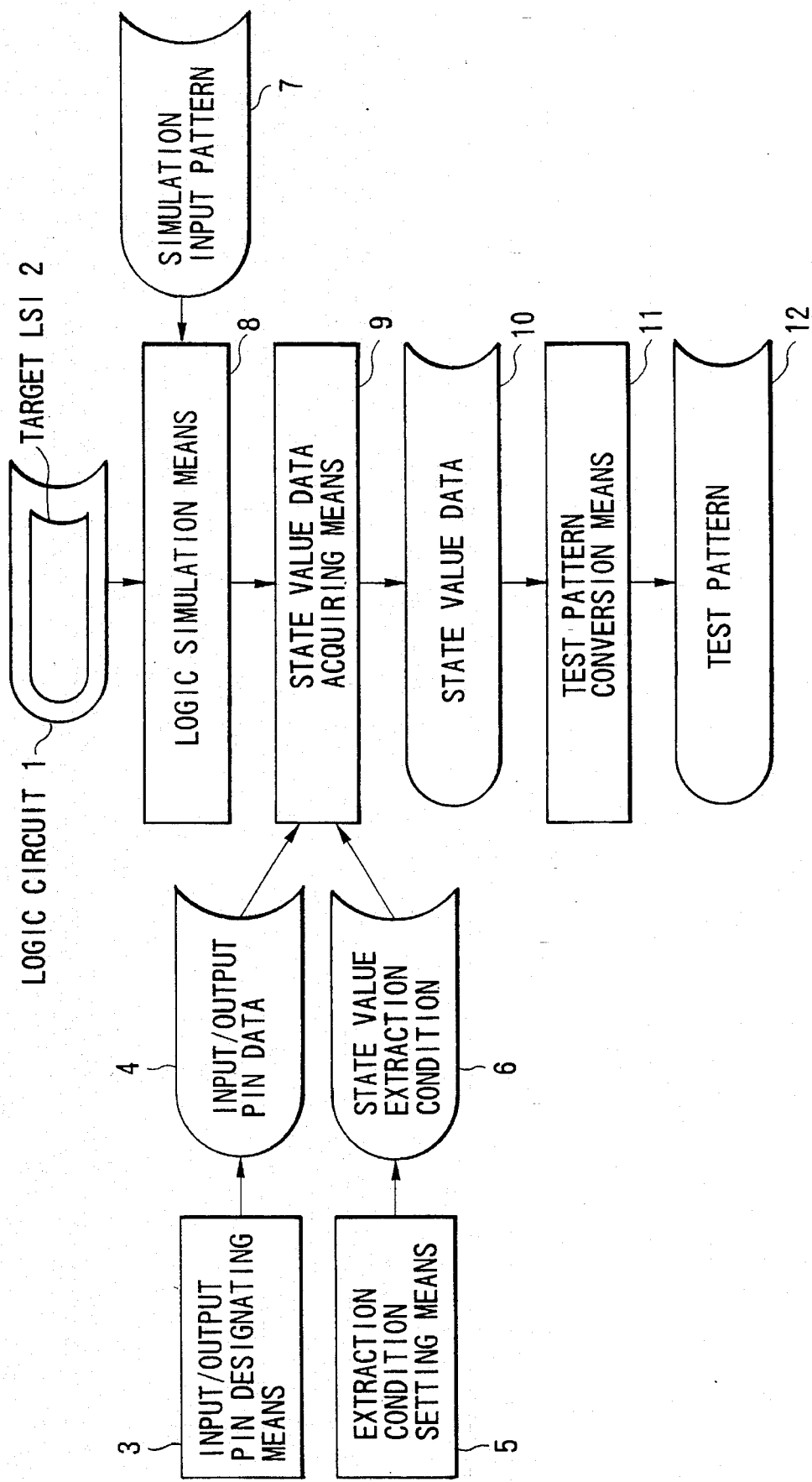
FIG. 1 is a block diagram showing an arrangement of an embodiment of the present invention.

Referring to FIG. 1, a system for forming test patterns for an LSI according to an embodiment of the present invention is constituted by an input/output pin designating means 3, an extraction condition setting means 5, a logic simulation means 8, a state value data acquiring means 9, and a test pattern conversion means 11.

The logic simulation means 8 receives arrangement data of a logic circuit 1 and simulation input patterns 7 so as to perform the logic simulation of the overall logic circuit 1 by using the simulation input patterns 7. In this case, the arrangement data of the logic circuit 1 includes arrangement data of a target LSI 2 (for which test patterns are to be formed). The logic simulation means 8 performs the logic simulation of the target LSI 2 simultaneously with the above-mentioned simulation.

The input/output pin designating means 3 serves to designate input/output pins of the target LSI 2 included in the logic circuit 1 and to provide input/output pin data 4 including the designation data to the state value data acquiring means 9.

Figure 2:
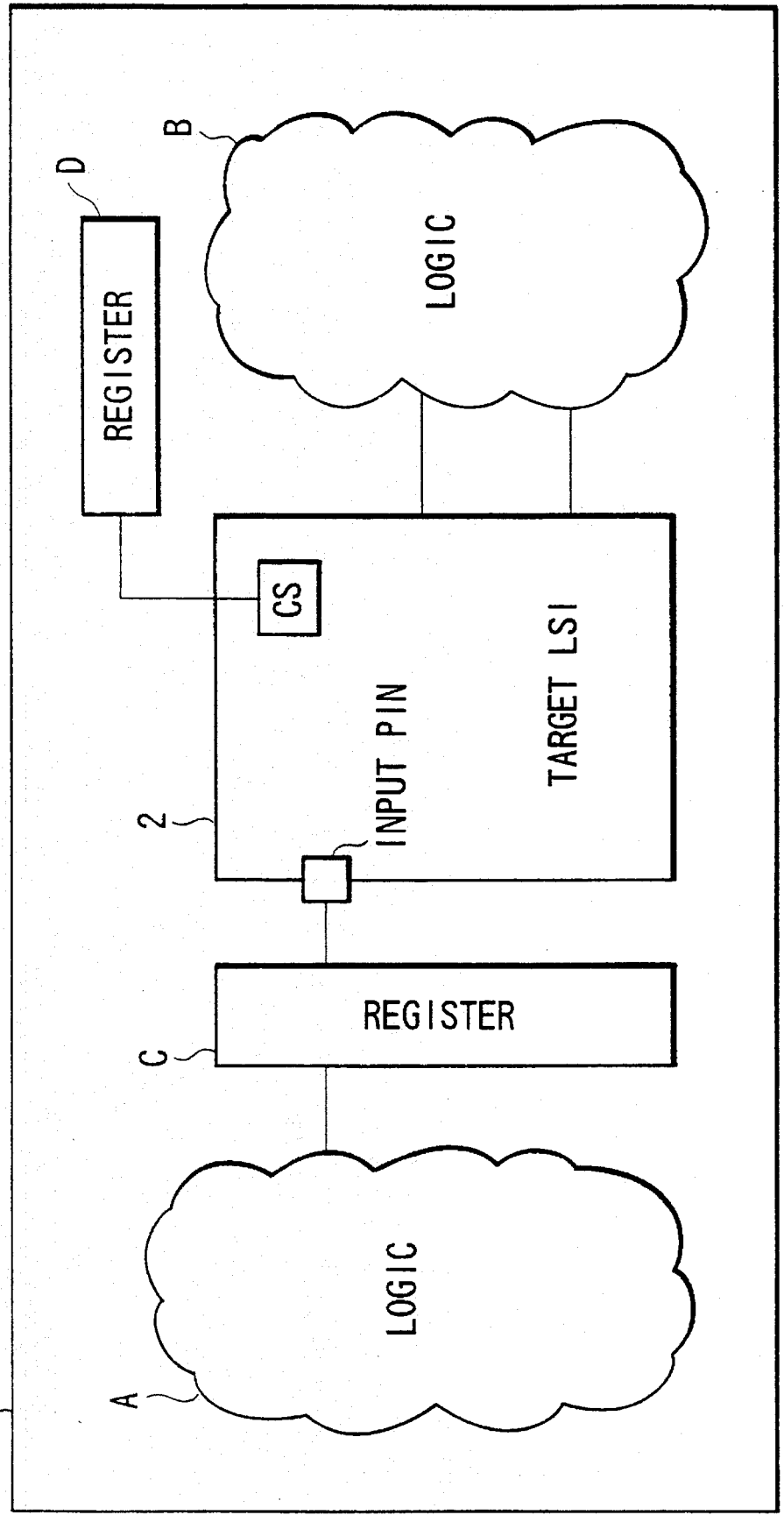
FIG. 2 is a block diagram for explaining a case wherein an extraction condition is set.

The extraction condition setting means 5 serves to set a condition for extracting the state values of the target LSI 2 included in the logic circuit 1 and to provide a state value extraction condition 6 representing the set condition to the state value data acquiring means 9. According to the present invention, the extraction condition setting means 5 is used to set a condition from which it is determined that the target LSI 2 is actually operated. FIG. 2 shows a case wherein a state value extraction condition is set. Referring to FIG. 2, the logic circuit 1 is generally constituted by a plurality of LSIs and ICs. In this case, one LSI 2 is selected as a test pattern formation target. Assume that the logic circuit 1 includes, in addition to the target LSI 2, a logic A, a register C for holding an input from the logic A and inputting data to an input pin P of the target LSI 2, a register D for holding a chip select signal CS from the target LSI 2, and a logic B for receiving an output from the target LSI 2. When the register value of the register C or D is different from its initial state, it is considered that the target LSI 2 is actually operated. In this case, if a condition "the register value of the register C or D is different from its initial state" is set as a state value extraction condition, an actual operation of the target LSI 2 can be determined when the condition is satisfied.

Referring to FIG. 1 again, the state value data acquiring means 9 serves to acquire data of the state values from the input/output pins of the target LSI 2, which are designated by the input/output pin data 4 from the input/output pin designating means 3, from the logic simulation means 8, which is performing the logic simulation, while the state value extraction condition 6 set by the extraction condition setting means 5 is satisfied, and to output the data as state value data 10. In general, the logic simulation means 8 repeatedly performs the simulation of all the simulation input patterns 7. For this reason, the state value data acquiring means 9 keeps determining fulfillment of the condition and acquiring the state value data 10 during this period.

The test pattern conversion means 11 converts the state value data 10 acquired by the state value data acquiring means 9 into a test pattern 12.

With the above-described arrangement, in this embodiment, the input/output pin data 4 for designating the input/output pins of the target LSI 2 is formed by using the input/output pin designating means 3, and the condition representing that the target LSI 2 is being operated is set as the state value extraction condition 6 by using the extraction condition setting means 5. Thereafter, the logic simulation means 8, the state value data acquiring means 9, and the test pattern conversion means 11 are operated. As a result, the logic simulation of the logic circuit 1 including the target LSI 2 is performed by the logic simulation means 8. When the LSI 2 is set in an operative state in the process of the simulation, data of the state values of the designated input/output pins of the target LSI 2 is acquired by the state value data acquiring means 9. The test pattern 12 is formed by the test pattern conversion means 11 on the basis of the acquired data.

As has been described above, the system for forming test patterns for an LSI according to the present invention comprises the extraction condition setting means for setting a condition for extracting the state values of the input/output pins of a target LSI (for which test patterns are to be formed), and the state value data acquiring means for acquiring data of the state values of the input/output pins of the LSI while the condition set by the extraction condition setting means is satisfied. With this arrangement, since a condition from which it is determined that a target LSI is actually operated can be set as an extraction condition, only effective data obtained during an actual operation of the target LSI are acquired to efficiently form test patterns.

In the above-described embodiment, the condition "the register value of the register C or D is different from its initial state" is set as a state value extraction condition. This condition is set on the assumption that the target LSI 2 has not been selected yet in an initial state at the start of simulation and the LSI 2 does not start to functionally operate until a register value for selecting the LSI 2 is set in the register C or D. If the target LSI 2 cannot be selected again by the value of the register C or D, a condition "the value of the register C is a, b, c, or d and the value of the register D is "1"" may be set to extract effective test patterns only while the LSI 2 is functionally operated.

The state value extraction condition is determined by a simulation result. The extraction condition setting means changes a simulation model to allow observation of the values of signal lines and of registers required to determine the provided condition or designates an observation point with respect to the logic simulation means. The state value data acquiring means compares the provided condition with the values of the signal lines and the registers obtained by the simulation result so as to determine whether the condition is satisfied. The values of the input/output pins of the target LSI 2 obtained by the simulation are extracted as test patterns only when it is determined that the condition is satisfied.

In addition, in the above embodiment, a condition "10 clocks or less are generated after the value of the register C is changed from a to b" can be set. In this case, the value of the register C is checked by the state value data acquiring means, and state values are extracted as test patterns until 10 clocks are generated after the value of the register C is changed from a to b. A state value extraction condition can be set not only from the values of registers and signal lines outside the target LSI 2 but from the values of registers and signal lines inside the LSI 2.

Furthermore, instead of only setting a period during which test patterns are extracted, a condition "a clock is changed from "0" to "1" and from "1" to "0"" may be added as a state value extraction condition. In this case, only effective test patterns can be extracted in synchronism with clocks instead of extracting all the state values of the input/output pins of the LSI 2 which are changed at slightly different timings due to differences between delay times. As a result, the number of patterns to be extracted can be greatly decreased without degrading the quality of test patterns.

As has been described above, according to the present invention, only effective test patterns can be effectively extracted from a large amount of simulation results.

What is claimed is:

1. A system for forming test patterns for a large scale integrated circuit (LSI) as a test pattern formation target on the basis of data of state values from input/output pins of said LSI acquired during logic simulation of a logic circuit including said LSI, comprising:

extraction condition setting means for setting a state value extraction condition for an internal circuit element of said logic circuit including said LSI, said internal circuit element having one of a first state and a second state, said state value extraction condition being satisfied when said internal circuit element is in said second state, said extraction condition setting means comparing the state of said internal circuit element with said state value extraction condition to determine whether said internal circuit element has entered said second state; and state value data acquiring means for acquiring said data of state values from said input/output pins of said LSI during logic simulation only when said state value extraction condition set by said extraction condition setting means is satisfied, wherein said test patterns of said LSI are created from said data of state values acquired by said state value data acquiring means.

2. A system according to claim 1, further including:

input/output pin designating means for designating input/output pins of a test pattern for said LSI and for supplying input/output pin data to said state value data acquiring means;

logic simulation means for supplying said state values from said input/output pins to said state value data acquiring means; and test pattern conversion means for converting said data of state values acquired by said state value data acquiring means into said test pattern.

3. A system according to claim 2, wherein said state value extraction condition is a condition representing that said LSI is determined to be actually operated.

4. A system according to claim 2, wherein said state value extraction condition is a condition representing register means in said LSI being in a non-initial state.

5. A system according to claim 2, wherein said state value extraction condition is a condition that is set independently of said test pattern for said LSI.

6. A system according to claim 1, in which the extraction condition setting means can be set either from the values of registers and signal lines outside of the LSI or from the values of registers and signal lines inside the LSI.

7. A system according to claim 1, in which the extraction condition includes a clock, effective test patterns being extracted only in synchronism with said clock.

8. A system according to claim 1, wherein said state value extraction condition is a condition representing a predefined number of clocks after said LSI is determined to be actually operated.

9. A system according to claim 1, wherein said internal circuit element is an internal register of said LSI.

10. A method of forming test patterns for a target large scale integrated circuit (LSI) based on state value data from said LSI during a logic circuit simulation, comprising the steps of:

setting a state value extraction condition for said LSI by an extraction condition setting circuit, said state value extraction condition being a change of a state value of an internal circuit element of said logic circuit including said LSI, said internal circuit element having one of a first state and a second state, and said state value extraction condition being set independently of said test patterns for said LSI;

comparing said state value extraction condition to the state of said internal circuit element, wherein said state value extraction condition is satisfied when said internal circuit element is in said second state;

acquiring said state value data from said LSI, when said LSI satisfies said state value extraction condition, by a state value data acquiring circuit in response to completion of said setting step; and converting said state value data obtained in said acquiring step to create said test patterns by a test pattern conversion circuit.

11. A method as in claim 10, further comprising the steps of:

inputting logic arrangement data from said LSI;

separately inputting simulation input patterns; and performing logic simulation by a logic simulation circuit using said logic arrangement data and said simulation input patterns.

12. A method as in claim 10, wherein said acquiring step includes acquiring said state value data from said LSI by said logic simulation circuit and supplying said state value data to said acquiring circuit.

* * * * *